(12) United States Patent
Zhao

(10) Patent No.: US 11,215,861 B2
(45) Date of Patent: Jan. 4, 2022

(54) DISPLAY PANEL AND METHOD FOR IMPROVING DISPLAY QUALITY THEREOF

(71) Applicant: BOE Technology Group Co., Ltd., Beijing (CN)

(72) Inventor: Lijun Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 302 days.

(21) Appl. No.: 16/317,853

(22) PCT Filed: May 11, 2018

(86) PCT No.: PCT/CN2018/086514
§ 371 (c)(1),
(2) Date: Jan. 15, 2019

(87) PCT Pub. No.: WO2019/001150
PCT Pub. Date: Jan. 3, 2019

(65) Prior Publication Data
US 2020/0341329 A1 Oct. 29, 2020

(30) Foreign Application Priority Data
Jun. 29, 2017 (CN) .................... 201710517408.X

(51) Int. Cl.
*G02F 1/13* (2006.01)
*G02F 1/1333* (2006.01)
(Continued)

(52) U.S. Cl.
CPC .. *G02F 1/133385* (2013.01); *G02F 1/136286* (2013.01); *H01L 23/38* (2013.01);
(Continued)

(58) Field of Classification Search
CPC ......... G02F 1/133385; G02F 1/136286; G02F 1/133514; G02F 1/133528; G02F 1/1368;
(Continued)

(56) References Cited

U.S. PATENT DOCUMENTS 5,986,306 A * 11/1999 Nakajima ............. H01L 21/266
257/353
6,504,215 B1 1/2003 Yamanaka et al.
(Continued)

FOREIGN PATENT DOCUMENTS

CN 1609664 A 4/2005
CN 1648811 A 8/2005
(Continued)

OTHER PUBLICATIONS

International Search Report and Written Opinion of the International Searching Authority (with English language translation of Written Opinion), International Application No. PCT/CN2018/086514, dated Jul. 18, 2018, 12 pp.
(Continued)

*Primary Examiner* — Charles D Garber
*Assistant Examiner* — S M Sohel Imtiaz
(74) *Attorney, Agent, or Firm* — Myers Bigel, P.A.

(57) ABSTRACT

The present disclosure provides a display panel and a method for improving display quality of the display panel. The display panel includes a temperature control apparatus. Specifically, the temperature control apparatus includes a temperature sensor in a non-display area of the display panel for detecting a temperature of the display panel, a change-temperature component in a display area of the display panel for performing a change-temperature treatment on the display panel, and a controller electrically connected to the temperature sensor and the change-temperature component
(Continued)

for controlling the change-temperature component to operate according to the temperature of the display panel.

8 Claims, 3 Drawing Sheets

(51) Int. Cl.
 *G02F 1/1362* (2006.01)
 *H01L 23/38* (2006.01)
 *H01L 27/12* (2006.01)
 *G02F 1/1335* (2006.01)
 *G02F 1/1368* (2006.01)

(52) U.S. Cl.
 CPC ........ *H01L 27/1214* (2013.01); *G02F 1/1368* (2013.01); *G02F 1/133514* (2013.01); *G02F 1/133528* (2013.01); *G02F 2201/121* (2013.01); *G02F 2201/123* (2013.01)

(58) Field of Classification Search
 CPC ........ G02F 2201/121; G02F 2201/123; G02F 1/133382; H01L 23/38; H01L 27/1214
 See application file for complete search history.

(56) References Cited

U.S. PATENT DOCUMENTS

| | | | | |
|---|---|---|---|---|
| 7,741,700 | B2* | 6/2010 | Kuroda | H01L 27/0605 |
| | | | | 257/577 |
| 2003/0231157 | A1* | 12/2003 | Sugino | G02F 1/133382 |
| | | | | 345/101 |
| 2004/0036834 | A1* | 2/2004 | Ohnishi | G02F 1/133382 |
| | | | | 349/177 |
| 2004/0263450 | A1* | 12/2004 | Lee | G09G 3/3611 |
| | | | | 345/87 |
| 2005/0083443 | A1* | 4/2005 | Lee | G02F 1/133382 |
| | | | | 349/21 |
| 2005/0093812 | A1* | 5/2005 | Lee | G09G 3/3648 |
| | | | | 345/101 |
| 2006/0033697 | A1* | 2/2006 | Yang | G09G 3/3648 |
| | | | | 345/101 |
| 2008/0088557 | A1 | 4/2008 | Choi | |
| 2010/0253675 | A1* | 10/2010 | Furukawa | G09G 3/3648 |
| | | | | 345/214 |
| 2013/0163204 | A1* | 6/2013 | Huang | H01L 51/524 |
| | | | | 361/704 |
| 2016/0021703 | A1* | 1/2016 | McDonald | H05B 1/0263 |
| | | | | 700/276 |

FOREIGN PATENT DOCUMENTS

| | | | |
|---|---|---|---|
| CN | 101165762 A | 4/2008 | |
| CN | 103377606 A | 10/2013 | |
| CN | 204086750 U | 1/2015 | |
| CN | 106842668 A | 6/2017 | |
| CN | 107092117 A | 8/2017 | |
| JP | 2000-111945 A | 4/2000 | |
| KR | 10-2005-0041590 A | 5/2005 | |
| TW | 200606548 | 2/2006 | |
| WO | WO-2016197966 A1 * | 12/2016 | ............. H01L 33/64 |

OTHER PUBLICATIONS

First Office Action with English language translation, CN Application No. 201710517408.X, dated Mar. 28, 2019, 13 pp.

* cited by examiner

DISPLAY PANEL AND METHOD FOR IMPROVING DISPLAY QUALITY THEREOF

CROSS-REFERENCE TO RELATED APPLICATION(S)

The present application is a 35 U.S.C. 371 national stage application of PCT International Application No. PCT/CN2018/086514, filed on May 11, 2018, which claims priority to Chinese Patent Application No. 201710517408.X filed on Jun. 29, 2017, the contents of which are incorporated herein by reference in their entireties.

TECHNICAL FIELD

The present disclosure relates to the field of display technology, and specifically to a display panel and a method for improving display quality of the display panel.

BACKGROUND

The characteristics of liquid crystal material vary significantly with temperature. With changes of the temperature, a threshold voltage of a liquid crystal display changes, an operating point drifts, and a response time also changes. All these changes lead to a reduction in picture quality of the liquid crystal display, thus seriously affecting a normal display of the liquid crystal display.

Therefore, current liquid crystal display devices still need to be improved.

SUMMARY

In one aspect of the present disclosure, an embodiment provides a display panel. According to an embodiment of the present disclosure, the display panel comprises a temperature control apparatus. Specifically, the temperature control apparatus comprises: a temperature sensor in a non-display area of the display panel for detecting a temperature of the display panel; a change-temperature component in a display area of the display panel for performing a change-temperature treatment on the display panel; and a controller electrically connected to the temperature sensor and the change-temperature component for controlling the change-temperature component to operate according to the temperature of the display panel.

According to an embodiment of the present disclosure, the temperature sensor comprises a thin film transistor.

According to an embodiment of the present disclosure, the change-temperature component comprises at least one of a heating component and a heat dissipation component.

According to an embodiment of the present disclosure, the display panel further comprises a common electrode, and the common electrode is configured to act as the heating component.

According to an embodiment of the present disclosure, the heat dissipation component comprises a silicon thin film heat sink or a semiconductor heat dissipation structure. Further, according to a specific embodiment, the semiconductor heat dissipation structure comprises: a first electrode; a P-type semiconductor layer electrically connected to the first electrode; an N-type semiconductor layer connected to the P-type semiconductor layer; and a second electrode electrically connected to the N-type semiconductor layer.

According to an embodiment of the present disclosure, the first electrode and the second electrode are located in a same layer, and the P-type semiconductor layer and the N-type semiconductor layer are located in a same layer.

According to an embodiment of the present disclosure, the display panel further comprises a gate signal line, and the second electrode is connected to the gate signal line.

According to an embodiment of the present disclosure, the heat dissipation component comprises a plurality of heat dissipation sub-components in an array.

According to an embodiment of the present disclosure, the display panel further comprises an array substrate, and the heat dissipation component is located on the array substrate.

In another aspect of the present disclosure, an embodiment further provides a method for improving display quality of a display panel. According to an embodiment of the present disclosure, the method comprises: detecting a temperature of the display panel; and performing a change-temperature treatment on the display panel if the temperature of the display panel exceeds a preset temperature range, such that the temperature of the display panel is maintained within the preset temperature range.

DETAILED DESCRIPTION OF THE DISCLOSURE

Figure 1:
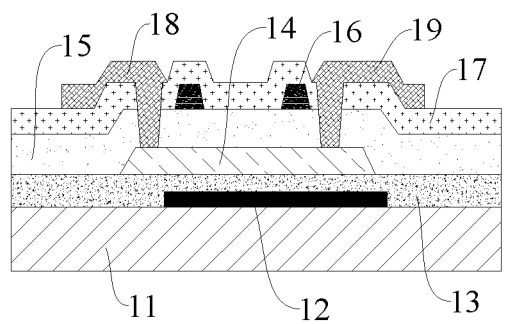
FIG. 1 is a schematic diagram exemplarily showing a structure of a thin film transistor acting as a temperature sensor according to an embodiment of the present disclosure.

Embodiments of the present disclosure are described in detail below. The embodiments described below are exemplary, the purpose of which is only for explaining the present disclosure, and which can't be understood as limiting the present disclosure. In the case where specific techniques or conditions are not indicated in the embodiments, it is done in accordance with the techniques or conditions as described in the art or in accordance with product specifications. All the reagents or instruments used are not shown with their manufacturers, and they are all conventional products that are commercially available.

In the following detailed description, reference numerals are used as follows to refer respectively to various components according to embodiments of the present disclosure: 11: substrate 12: light shielding layer 13: buffer layer 14: active layer 15: gate insulating layer 16: gate 17: interlayer insulating layer 18: drain 19: source 1: display area 2: non-display area 10: temperature sensor 100: lower polarizer 41: substrate 20: heat dissipation component 42: thin film transistor 43: pixel electrode 400: array substrate 300: liquid crystal 52: common electrode 51: color filter layer 500: color film substrate 200: upper polarizer 300: protective cover 44: insulating layer 21: first electrode 22: P-type semiconductor layer 23: N-type semiconductor layer and 24: second electrode.

In one aspect of the present disclosure, an embodiment provides a display panel. According to an embodiment of the present disclosure, the display panel comprises a temperature control apparatus. Specifically, the temperature control apparatus may comprise: a temperature sensor, which is disposed in a non-display area of the display panel for detecting a temperature of the display panel; a change-temperature component, which is disposed in a display area of the display panel for performing a change-temperature on the display panel, for example, for changing the temperature of the display panel; and a controller, which is electrically connected to the temperature sensor and the change-temperature component, for receiving a signal detected from the temperature sensor, determining the temperature of the display panel, and comparing the temperature of the display panel with a preset temperature range, thus controlling the change-temperature component to operate according to the comparison result. The present inventors have found that by setting the temperature control apparatus, an operating temperature of the display panel can be effectively controlled. In this way, the display panel operates at a suitable temperature, and thus is not affected by an environment temperature. Thereby, the display panel is able to display a high quality picture at different environment temperatures.

Specifically speaking, the controller may be provided with a first preset temperature and a second preset temperature, which correspond respectively to the highest temperature and the lowest temperature that the display panel can withstand under normal operating situations. It can be seen that a temperature range defined by the first preset temperature and the second preset temperature is the preset temperature range. After receiving the signal from the temperature sensor, the controller may determine the temperature of the display panel and compare the temperature of the display panel with the first preset temperature and the second preset temperature. If the temperature of the display panel is higher than the first preset temperature or lower than the second preset temperature, the controller may control the change-temperature component to start operating until the temperature of the display panel is between the first preset temperature and the second preset temperature. If the temperature of the display panel is between the first preset temperature and the second preset temperature, the controller does not perform any operation, and the temperature sensor continues to detect the temperature of the display panel. In this way, the temperature of the display panel can be effectively controlled to be maintained within the most suitable temperature range. Thus, it is ensured that the quality of the display picture is high and not affected by an ambient temperature. For example, under a severer environment, the display panel can still operate normally, and the display quality is high.

According to an embodiment of the present disclosure, the temperature sensor may employ any suitable type, as long as the temperature of the display panel can be effectively detected. Since a current of a thin film transistor (TFT) increases with temperature (when the temperature rises, a mobility of carriers increases, thus causing the current to increase), the temperature of the display panel can be determined by detecting a magnitude of the TFT current. Therefore, in some embodiments of the present disclosure, the temperature sensor employed includes a thin film transistor. Thereby, the temperature sensor can be formed directly by using existing processes for the display panel without leading to additional preparation processes. In this way, the display panel is provided with advantages such as simple operation steps, low cost, and an ideal temperature detection effect and so on.

According to an embodiment of the present disclosure, the thin film transistor having any suitable type and structure may be employed to form the temperature sensor, and those skilled in the art can select flexibly according to actual needs. For example, the temperature sensor can include, but is not limited to, an amorphous silicon thin film transistor, a low temperature polysilicon thin film transistor, an oxide thin film transistor and so on, and structures of these thin film transistors may be a bottom gate structure or a top gate structure and so on. A temperature sensor according to an embodiment of the present disclosure will be illustrated in detail below by taking the low temperature polysilicon thin film transistor of the top gate structure as an example.

Specifically, referring to FIG. 1, a thin film transistor acting as a temperature sensor may include: a substrate 11; a light shielding layer 12 disposed on one side of the substrate 11; a buffer layer 13 disposed on one side of the substrate 11 and covering the light shielding layer 12; an active layer 14 disposed on one side of the buffer layer 13 away from the substrate 11; a gate insulating layer 15 disposed on one side of the buffer layer 13 away from the substrate 11 and covering the active layer 14; a gate 16 disposed on one side of the gate insulating layer 15 away from the substrate 11; an interlayer insulating layer 17 disposed on one side of the gate insulating layer 15 away from the substrate 11 and covering the gate 16; as well as a drain 18 and a source 19 disposed on one side of the interlayer insulating layer 17 away from the substrate 11 and electrically connected to the active layer 14.

Figure 2:
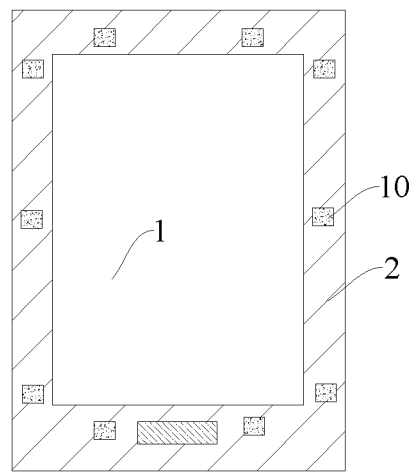
FIG. 2 is a schematic diagram exemplarily showing a distribution of a temperature sensor on a display panel according to an embodiment of the present disclosure.

According to an embodiment of the present disclosure, a number and a distribution mode of the temperature sensor can also be selected flexibly according to actual needs, as long as the temperature of the display panel can be effectively detected. In some embodiments of the present disclosure, referring to FIG. 2, the temperature sensor 10 may include a plurality of temperature sub-sensors, and the plurality of temperature sub-sensors are distributed in a non-display area 2 of the display panel and spaced apart from each other. Thereby, the temperature at each position of the display panel can be effectively monitored, thus avoiding influences on the overall display quality by local overheating or overcooling.

According to an embodiment of the present disclosure, the change-temperature component may be formed by any suitable kind and setting manner, as long as the temperature of the display panel can be effectively changed, and those skilled in the art can select flexibly upon actual needs. In some embodiments of the present disclosure, in order to better control the temperature of the display panel, the change-temperature component may include at least one of a heating component and a heat dissipation component. Thereby, the temperature of the display panel can be quickly and effectively adjusted into a suitable range, and thus it is ensured that the display panel has a high display quality at different environment temperatures.

According to an embodiment of the present disclosure, the heating component may also have a variety of suitable kinds and setting manners, as long as the display panel can be effectively heated, and those skilled in the art can select flexibly upon actual needs. For example, an additional heating component can be added, or an existing structure of the display panel can also be re-used as the heating component. In some embodiments of the present disclosure, a common electrode of the display panel can be re-used as the heating component. Thereby, the existing structure of the display panel can be sufficiently utilized and additional structures and manufacturing processes are not required, thus greatly reducing the cost and improving an integration of the display panel.

Specifically, the common electrode of the display panel is generally formed of an ITO thin film. In this case, by applying a voltage to the ITO thin film, heat can be generated, thus achieving the purpose of heating the display panel. In the display panel, the common electrode is usually connected to a constant voltage when in a normal operation. After that, if the display panel needs to be heated, the voltage at the common electrode can be increased by the controller, so that the common electrode generates more heat, thus heating the display panel. At the same time, in order to guarantee the normal operation of display, a voltage at a pixel electrode can be increased, such that a voltage difference between the common electrode and the pixel electrode does not change. Thus, it is assured that the display function and the heating function can be conducted simultaneously.

Figure 3:
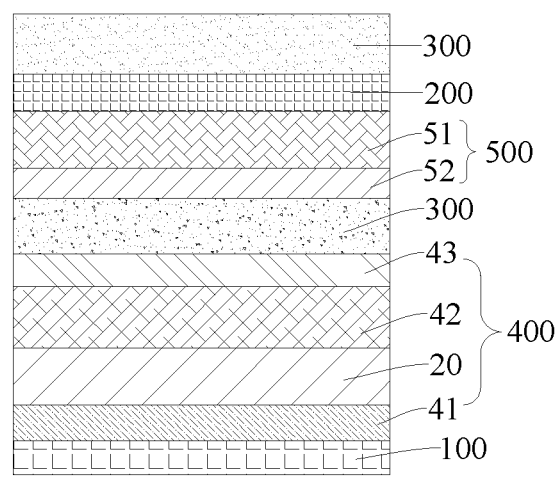
FIG. 3 is a schematic diagram exemplarily showing a structure of a TN mode display panel according to an embodiment of the present disclosure.
Figure 4:
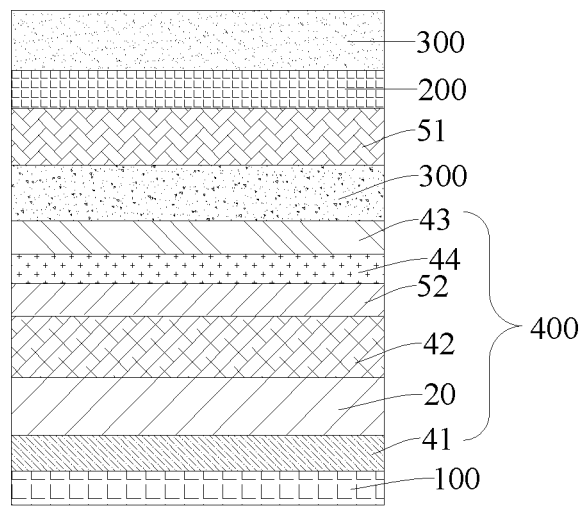
FIG. 4 is a schematic diagram exemplarily showing a structure of an ADS mode display panel according to an embodiment of the present disclosure.

According to an embodiment of the present disclosure, the heating component can be disposed at any suitable position, and those skilled in the art can select flexibly upon actual needs. According to some embodiments of the present disclosure, in the display panels that are in different display modes, the heating component may be disposed at different positions, and such specific positions may be determined according to a set position of the common electrode. For example, referring to FIG. 3, in a TN mode display panel, the common electrode may be disposed between a color film substrate and a liquid crystal layer. Referring to FIG. 4, in an ADS mode display panel, the common electrode may be disposed between the thin film transistor and an insulating layer. Obviously, those skilled in the art can understand that the structures shown in FIG. 3 and FIG. 4 are only for exemplarily illustrating the display panels according to embodiments of the present disclosure, and should not be understood as limiting the present disclosure. That is to say, in an embodiment of the present disclosure, the display panel may also utilize other various suitable structures.

According to an embodiment of the present disclosure, the heat dissipation component may be designed to have various suitable structures, as long as the temperature of the display panel can be effectively reduced, and those skilled in the art can select flexibly upon actual needs. For example, the heat dissipation component can include, but is not limited to, a silicon thin film heat sink or a semiconductor heat dissipation structure. In some embodiments of the present disclosure, referring to FIG. 5, the heat dissipation component 20 can be formed of a semiconductor heat dissipation structure. Specifically, the semiconductor heat dissipation structure may include: a first electrode 21; a P-type semiconductor layer 22, which is electrically connected to the first electrode 21; an N-type semiconductor layer 23, which is connected to the P-type semiconductor layer 22; and a second electrode 24, which is electrically connected to the N-type semiconductor layer 23. Thereby, the heat dissipation component can be integrated on an array substrate of the display panel without additional manufacturing processes. Furthermore, the operation steps of such heat dissipation component are also relatively simple and thus easy to control.

Specifically, the first electrode and the second electrode may be respectively connected to a negative voltage and a positive voltage. In this case, when there is a direct current, carrier holes and electrons will have different potential energies within the semiconductor layer and the electrode. Thereby, a transfer and conversion of energy occur at a junction between the electrode and the semiconductor layer. Specifically speaking, the potential energy of the holes within the P-type semiconductor layer is higher than the potential energy of the holes within the first electrode. Under the action of an external electric field, when passing through an interface between the P-type semiconductor layer and the first electrode, the holes need to absorb a part of heat from the first electrode and increase its own potential energy, so as to enter the P-type semiconductor layer. As such, at the interface between the P-type semiconductor layer and the first electrode, energy loses and temperature decreases. In contrast, the potential energy of the electrons within the N-type semiconductor layer is greater than the potential energy of the electrons in the second electrode. Therefore, under the action of the external electric field, when passing through the interface between the N-type semiconductor layer and the second electrode, the electrons need to absorb a part of heat from the second electrode and convert it into its own potential energy, so as to enter the N-type semiconductor layer. As such, at the interface between the N-type semiconductor layer and the second electrode, energy loses and temperature decreases. In this way, a heat dissipation effect can be achieved on the display panel.

Figure 5:
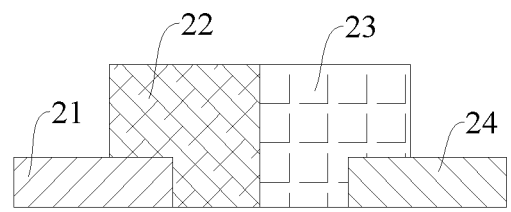
FIG. 5 is a schematic diagram exemplarily showing a structure of a heat dissipation component according to an embodiment of the present disclosure.

According to an embodiment of the present disclosure, referring to FIG. 5, the first electrode 21 and the second electrode 24 are disposed in the same layer, and the P-type semiconductor layer 23 and the N-type semiconductor layer 24 are disposed in the same layer. Thereby, the manufacturing steps are simple and the thickness is thin, thus conforming to the development trend of thinness and lightness.

According to an embodiment of the present disclosure, the first electrode, the second electrode, the P-type semiconductor layer and the N-type semiconductor layer may be formed by any suitable material, as long as the use requirements can be satisfied, and those skilled in the art can select flexibility upon actual needs. For example, the first electrode and the second electrode may be formed by the same metal material as the gate in the thin film transistor connected to the pixel electrode, and the P-type semiconductor layer and the N-type semiconductor layer may be any semiconductor material as known in the art.

According to an embodiment of the present disclosure, in order to further simplify in structure, the second electrode may be connected to a gate signal line of the display panel. Specifically, the first electrode may be an individual signal trace, and the second electrode may be a signal trace shared with a gate (a gate in the thin film transistor connected to the pixel electrode, for display purpose) of the display panel. As such, when the display panel does not need to be cooled down, the gate signal of the display panel may be a display signal. In contrast, when the display panel needs to be cooled down, the gate signal of the display panel is a fixed direct current signal, thus forming a positive and a negative direct current signal together with the first electrode signal, and performing a cooling treatment on the display panel.

According to an embodiment of the present disclosure, in order to effectively guarantee the normal display, the heat dissipation function and the display function can be operated in a time division manner, and the time for cooling operation is set to be short. For example, the cooling function and the display function can be operated multiple times at intervals. Thereby, the human eyes will not be able to distinguish subtle changes in the display picture, and thus it does not affect the display function.

Figure 6:
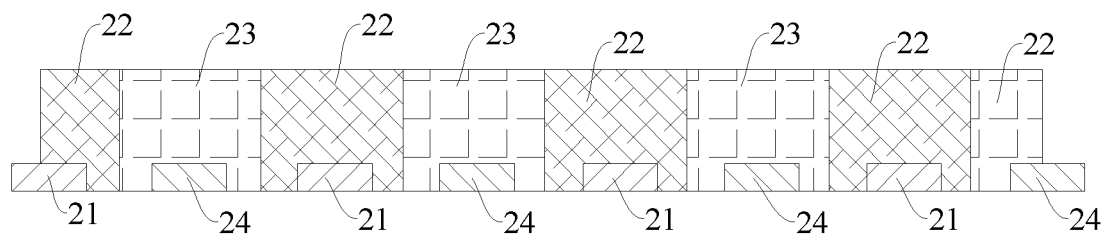
FIG. 6 is a schematic diagram exemplarily showing a plurality of heat dissipation sub-components distributed in an array according to an embodiment of the present disclosure.

According to an embodiment of the present disclosure, an area of the display panel is generally large. Therefore, in order to make the heat dissipation uniform, referring to FIG. 6, the heat dissipation component may be set to include a plurality of heat dissipation sub-components, and they are distributed in an array. Specifically, the first electrode is connected to a negative voltage and the second electrode is connected to a positive voltage. Thereby, the heat dissipation is more uniform, thus obtaining a uniform distribution in temperature of the display panel and avoiding local temperatures that are too high or too low.

According to an embodiment of the present disclosure, the heat dissipation component may be disposed at any suitable position in the display panel, and those skilled in the art can select flexibly upon actual needs. In some embodiments of the present disclosure, referring to FIG. 3 and FIG. 4, the heat dissipation component 20 may be disposed on a substrate 41 on which the array substrate 400 of the display panel is located. Thereby, the heat dissipation component 20 may be integrated with the array substrate, and is compatible with a preparation method for the array substrate.

In another aspect of the present disclosure, an embodiment further provides a method for improving display quality of a display panel. According to an embodiment of the present disclosure, firstly, a temperature of the display panel can be detected, and when the temperature of the display panel exceeds a preset temperature range, a change-temperature treatment is performed on the display panel, so that the temperature of the display panel is maintained within the preset temperature range. Using this method, an operating temperature of the display panel can be controlled quickly and effectively, so that the display panel is always set at a suitable operating temperature. Thereby, it is ensured that the display panel always has a high display quality, and is not affected by an ambient temperature.

Figure 7:
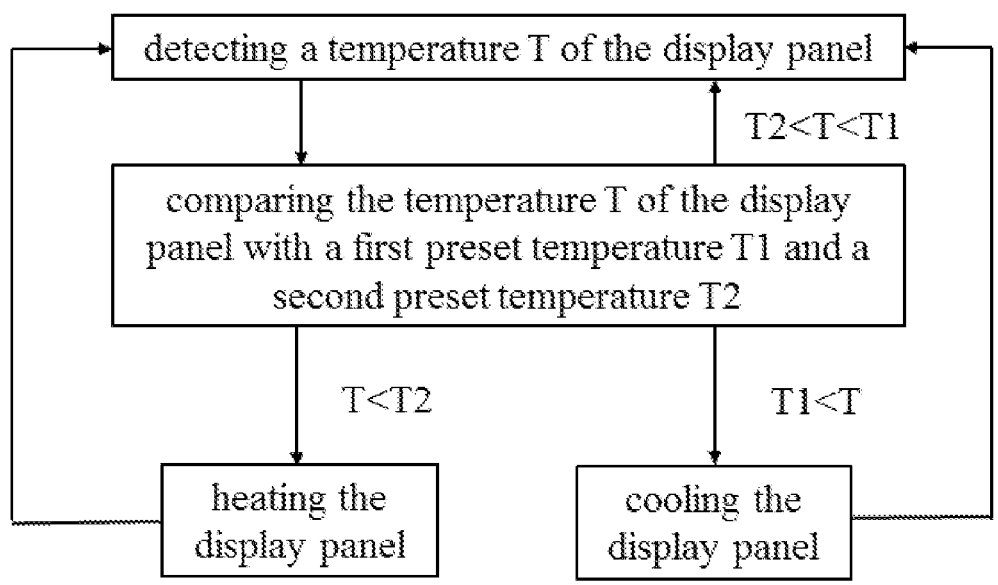
FIG. 7 is a schematic flow diagram exemplarily showing a method for improving display quality of a display panel according to an embodiment of the present disclosure.

According to a specific example of the present disclosure, referring to FIG. 7, the method for improving display quality of a display panel may include steps of: detecting a temperature T of the display panel; determining whether the temperature of the display panel exceeds a preset temperature range, and performing a cooling treatment on the display panel if the temperature T of the display panel is higher than a first preset temperature T1; and performing a heating treatment on the display panel if the temperature T of the display panel is lower than a second preset temperature T2. Thereby, an operating temperature of the display panel can be controlled quickly and efficiently, so that the display panel is always maintained at a suitable operating temperature. In this way, it can be ensured that the display panel always has a high display quality and is not affected by an ambient temperature.

According to an embodiment of the present disclosure, the first preset temperature and the second preset temperature may be selected flexibly according to a specific application, as long as the display panel is able to operate normally between the first preset temperature and the second preset temperature, thus ensuring an ideal display quality. In this regard, those skilled in the art can flexibly select specific values for the first preset temperature and the second preset temperature according to actual needs. For example, the first preset temperature may be the highest temperature that the display panel can withstand when in a normal operation, and the second preset temperature may be the lowest temperature that the display panel can withstand in the normal operation. Of course, in order to better ensure that the display panel has a high display quality, the first preset temperature may also be appropriately reduced and the second preset temperature may be increased. In this way, the temperature of the display panel is not set at a critical temperature, thus ensuring a better quality of display picture. In addition, in some special circumstances, the first preset temperature and the second preset temperature may also be set to be consistent, so that the display panel can operate under a constant temperature condition, and the display picture quality is further improved.

In the above description of the present specification, references to terms such as "one embodiment", "some embodiments", "example", "specific example", or "some examples" and so on mean that a specific feature, structure, material, or characteristic as described in connection with the embodiment or example is included in at least one embodiment or example of the present disclosure. In the present specification, the schematic expression of the above mentioned terms is not necessarily directed to the same embodiment or example. Also, the described specific feature, structure, material, or characteristic may be joined in a suitable manner in any one or more embodiments or examples. Furthermore, in case of no contradiction between each other, the different embodiments or examples, as well as features of the different embodiments or examples described in the present specification, can be joined and combined by those skilled in the art.

While embodiments of the present disclosure have been shown and described above, it can be understood that the above mentioned embodiments are exemplary and can't be understood as limiting the present disclosure. In fact, various changes, modifications, replacements and variations can be made by those of ordinary skill in the art to the above mentioned embodiments within the scope of the present disclosure.

The invention claimed is:

1. A display panel comprising a temperature control apparatus, the temperature control apparatus comprising:
 a temperature sensor in a non-display area of the display panel, wherein the temperature sensor is configured to detect a temperature of the display panel;
 a change-temperature component in a display area of the display panel, wherein the change-temperature component is configured to perform a change-temperature treatment on the display panel; and
 a controller electrically connected to the temperature sensor and the change-temperature component, wherein the controller is configured to control the change-temperature component to operate according to the temperature of the display panel,
 wherein the change-temperature component comprises at least one of a heating component and a heat dissipation component,
 wherein the heat dissipation component comprises a semiconductor heat dissipation structure, and
 wherein the semiconductor heat dissipation structure comprises:
  a first electrode;
  a P-type semiconductor layer electrically connected to the first electrode;
  an N-type semiconductor layer connected to the P-type semiconductor layer; and a second electrode electrically connected to the N-type semiconductor layer,
wherein the first electrode and the second electrode are in a same layer, and
wherein the P-type semiconductor layer and the N-type semiconductor layer are in a same layer.

2. The display panel according to claim 1, wherein the temperature sensor comprises a thin film transistor.

3. The display panel according to claim 1,
wherein the display panel further comprises a common electrode, and
wherein the common electrode is configured to act as the heating component.

4. The display panel according to claim 1, wherein the heat dissipation component comprises a silicon thin film heat sink.

5. The display panel according to claim 1, wherein the heat dissipation component comprises a plurality of heat dissipation sub-components in an array.

6. The display panel according to claim 1,
wherein the display panel further comprises an array substrate, and
wherein the heat dissipation component is on the array substrate.

7. A display panel comprising a temperature control apparatus, the temperature control apparatus comprising:
a temperature sensor in a non-display area of the display panel, wherein the temperature sensor is configured to detect a temperature of the display panel;
a change-temperature component in a display area of the display panel, wherein the change-temperature component is configured to perform a change-temperature treatment on the display panel; and
a controller electrically connected to the temperature sensor and the change-temperature component, wherein the controller is configured to control the change-temperature component to operate according to the temperature of the display panel,
wherein the change-temperature component comprises at least one of a heating component and a heat dissipation component,
wherein the heat dissipation component comprises a semiconductor heat dissipation structure, and
wherein the semiconductor heat dissipation structure comprises:
a first electrode;
a P-type semiconductor layer electrically connected to the first electrode;
an N-type semiconductor layer connected to the P-type semiconductor layer; and
a second electrode electrically connected to the N-type semiconductor layer,
wherein the display panel further comprises a gate signal line, and
wherein the second electrode is connected to the gate signal line.

8. A method for improving display quality of a display panel comprising:
detecting a temperature of the display panel; and
determining whether the temperature of the display panel exceeds a preset temperature range; and
performing a change-temperature treatment on the display panel when the temperature of the display panel exceeds the preset temperature range, such that the temperature of the display panel is maintained within the preset temperature range,
wherein the change-temperature treatment comprises at least one of a heating component and a heat dissipation component,
wherein the heat dissipation component comprises a semiconductor heat dissipation structure, and
wherein the semiconductor heat dissipation structure comprises:
a first electrode;
a P-type semiconductor layer electrically connected to the first electrode;
an N-type semiconductor layer connected to the P-type semiconductor layer; and
a second electrode electrically connected to the N-type semiconductor layer,
wherein the first electrode and the second electrode are in a same layer, and
wherein the P-type semiconductor layer and the N-type semiconductor layer are in a same layer.

* * * * *